US 11,620,500 B2

(12) United States Patent
Chen et al.

(10) Patent No.: US 11,620,500 B2
(45) Date of Patent: Apr. 4, 2023

(54) SYNAPSE SYSTEM AND SYNAPSE METHOD TO REALIZE STDP OPERATION

(71) Applicant: Winbond Electronics Corp., Taichung (TW)

(72) Inventors: Frederick Chen, Tainan (TW); Ping-Kun Wang, Taichung (TW); Shao-Ching Liao, Miaoli County (TW); Chih-Cheng Fu, New Taipei (TW); Ming-Che Lin, Taichung (TW); Yu-Ting Chen, Kaohsiung (TW); Seow-Fong (Dennis) Lim, Fremont, CA (US)

(73) Assignee: WINBOND ELECTRONICS CORP., Taichung (TW)

( * ) Notice: Subject to any disclaimer, the term of this patent is extended or adjusted under 35 U.S.C. 154(b) by 1146 days.

(21) Appl. No.: 15/868,392

(22) Filed: Jan. 11, 2018

(65) Prior Publication Data
US 2019/0213468 A1 Jul. 11, 2019

(51) Int. Cl.
*G06N 3/049* (2023.01)
*G06N 3/08* (2023.01)
(Continued)

(52) U.S. Cl.
CPC ............. *G06N 3/049* (2013.01); *G06N 3/065* (2023.01); *G06N 3/08* (2013.01); *G11C 11/54* (2013.01); *G11C 13/0002* (2013.01)

(58) Field of Classification Search
CPC ............. G06N 3/02; G06N 3/00; H04L 27/00
See application file for complete search history.

(56) References Cited

U.S. PATENT DOCUMENTS 9,774,261 B2 * 9/2017 Bui .................. G06F 1/266
11,157,805 B2 * 10/2021 Yajima ............. G11C 13/0004
(Continued)

FOREIGN PATENT DOCUMENTS

CN 102610274 A 7/2012

OTHER PUBLICATIONS

Ambrogio, Stefano, et al. "Neuromorphic learning and recognition with one-transistor-one-resistor synapses and bistable metal oxide RRAM." IEEE Transactions on Electron Devices 63.4 (2016): 1508-1515. (Year: 2016).*
(Continued)

*Primary Examiner* — Miranda M Huang
*Assistant Examiner* — Sidney Vincent Bostwick
(74) *Attorney, Agent, or Firm* — Muncy, Geissler, Olds & Lowe, P.C.

(57) ABSTRACT

A synapse system is provided which includes three transistors and a resistance-switching element arranged between two neurons. The resistance-switching element has a resistance value and it is arranged between two neurons. A first transistor is connected between the resistance-switching element and one of the neurons. A second transistor and a third transistor are arranged between the two neurons, and are connected in series which interconnects with the gate of the first transistor. A first input signal is transmitted from one of the neurons to the other neuron through the first transistor. A second input signal is transmitted from one of the neurons to the other neuron through the second transistor and the third transistor. The resistance value of the resistance-switching element is changed based on the time difference between the first input signal and the second input signal.

20 Claims, 7 Drawing Sheets

(51) Int. Cl.
  *G11C 11/54* (2006.01)
  *G06N 3/065* (2023.01)
  *G11C 13/00* (2006.01)

(56) References Cited

U.S. PATENT DOCUMENTS

| | | | | |
|---|---|---|---|---|
| 2012/0084241 A1* | 4/2012 | Friedman | ............... | G06N 3/049 |
| | | | | 706/27 |
| 2014/0358834 A1* | 12/2014 | Kim | ..................... | G06N 3/049 |
| | | | | 706/25 |
| 2016/0133317 A1* | 5/2016 | Lee | ................... | H01L 27/11568 |
| | | | | 257/314 |
| 2017/0270404 A1* | 9/2017 | Eleftheriou | .......... | G06N 3/0635 |
| 2017/0338647 A1* | 11/2017 | Xiang | .................. | H02H 7/0858 |

OTHER PUBLICATIONS

Tseng, Ko-Chung, Alice C. Parker, and Jonathan Joshi. "A directionally-selective neuromorphic circuit based on reciprocal synapses in Starburst Amacrine Cells." 2011 Annual International Conference of the IEEE Engineering in Medicine and Biology Society. IEEE, 2011. (Year: 2011).*

Taiwan Patent Office. Office Action, dated Aug. 28, 2019. 4 pages.

\* cited by examiner

SYNAPSE SYSTEM AND SYNAPSE METHOD TO REALIZE STDP OPERATION

BACKGROUND OF THE INVENTION

Field of the Invention

The disclosure generally relates to a synapse system and a synapse method for performing and realizing the neuromorphic operation of spike-timing dependent plasticity (STDP).

Description of the Related Art

In a nerve network, neurons are responsible for the intellectual capability for learning and memory. Neurons use their synapses to exchange signals with thousands of other neurons. Thus, neurons are the structural and functional base units for data transmission. A synapse refers to a junction between two neurons at which an axon of first neuron and a dendrite of a second neuron are positioned next to each other for the exchange of signals. A single neuron is generally connected with thousands of other neurons via synapses. Therefore, a synapse system that includes a plurality of semiconductor circuits is designed to mimic the operation of a biological nervous system.

Specifically, an RRAM array provides an opportunity to combine computation and memory together to form a high-efficiency, low-resource execution of matrix-vector multiplication, which is typically used in neural networks and pattern recognition. However, in implementing such a synapse system with the RRAM, it is difficult to integrate a large number of artificial neurons in a small area using general semiconductor manufacturing technology. How to realize the neuromorphic operation of an STDP is an important issue in this area of technology.

BRIEF SUMMARY OF THE INVENTION

In order to solve the aforementioned problem, the invention proposes a synapse system to realize spike timing dependent plasticity (STDP) operation. The synapse system includes three transistors and a resistance-switching element arranged between two neurons. The resistance-switching element has a resistance value and it is arranged between two neurons. A first transistor is connected between the resistance-switching element and one of the neurons. A second transistor and a third transistor are arranged between the two neurons, and are connected in series which interconnects with the gate of the first transistor. A second input signal is transmitted from one of the neurons to the other neuron through the first transistor. A first input signal is transmitted from one of the neurons to the other neuron through the second transistor and the third transistor. The resistance value of the resistance-switching element is changed based on the time difference between the first input signal and the second input signal.

Each of two neurons includes a pre-synaptic portion and a post-synaptic portion, the first input signal is generated by the pre-synaptic portion, and the second input signal is generated by the post-synaptic portion. The first transistor is connected between the post-synaptic portions of the two neurons; and the second transistor and the third transistor are connected between the pre-synaptic portions of the two neurons.

The first input signal includes a first rectangle waveform and a first triangle waveform which is linearly decreasing. The second input signal includes a second rectangle waveform and a second exponential waveform which is decaying with an opposite polarityE In order to perform a potentiation status of the STDP operation, after the first input signal is transmitted, the second input signal is transmitted. The second rectangle waveform overlaps with the first triangle waveform. The decrease of the resistance value of the resistance-switching element is inversely proportional to the time difference between the second rectangle waveform and the first triangle waveform. The decrease of the resistance value of the resistance-switching element is proportional to the amplitude of the first triangle waveform:

In order to perform a depression status of the STDP operation, after the first input signal is transmitted, the second input signal is transmitted. The second rectangle waveform overlaps with the first triangle waveform. In other words, the second rectangle waveform directly follows the first triangle waveform. The increase of the resistance value of the resistance-switching element is inversely proportional to the time difference between the second rectangle waveform and the first triangle waveform. The increase of the resistance value of the resistance-switching element is proportional to the amplitude of the first rectangle waveform.

Furthermore, the second input signal further includes a second inverse rectangle waveform with an opposite polarity, and the second inverse rectangle waveform is utilized to overlap with the first rectangle waveform. The duration between the first triangle waveform and the first rectangle waveform is greater than the duration between the second rectangle waveform and the second inverse rectangle waveform. The duration between the second exponential waveform and the second inverse rectangle waveform is greater than the duration between the first triangle waveform and the first rectangle waveform.

In another aspect of the invention, a synapse method of realizing an STDP operation between two neurons. The synapse method includes arranging a resistance-switching element having a resistance value between the two neurons; arranging a first transistor connected between the resistance-switching element and one of the neurons; arranging a second transistor and a third transistor between the two neurons, connected in series which interconnects with the gate of the first transistor, transmitting a second input signal from one of the neurons to the other neuron through the first transistor; transmitting a first input signal from one of the neurons to the other neuron through the second transistor and the third transistor; and changing the resistance value of the resistance-switching element based on the time difference between the first input signal and the second input signal.

Other aspects and features of the present invention will become apparent to those with ordinarily skill in the art upon review of the following descriptions of specific embodiments of the synapse system and the synapse method.

BRIEF DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF THE INVENTION

Figure 1:
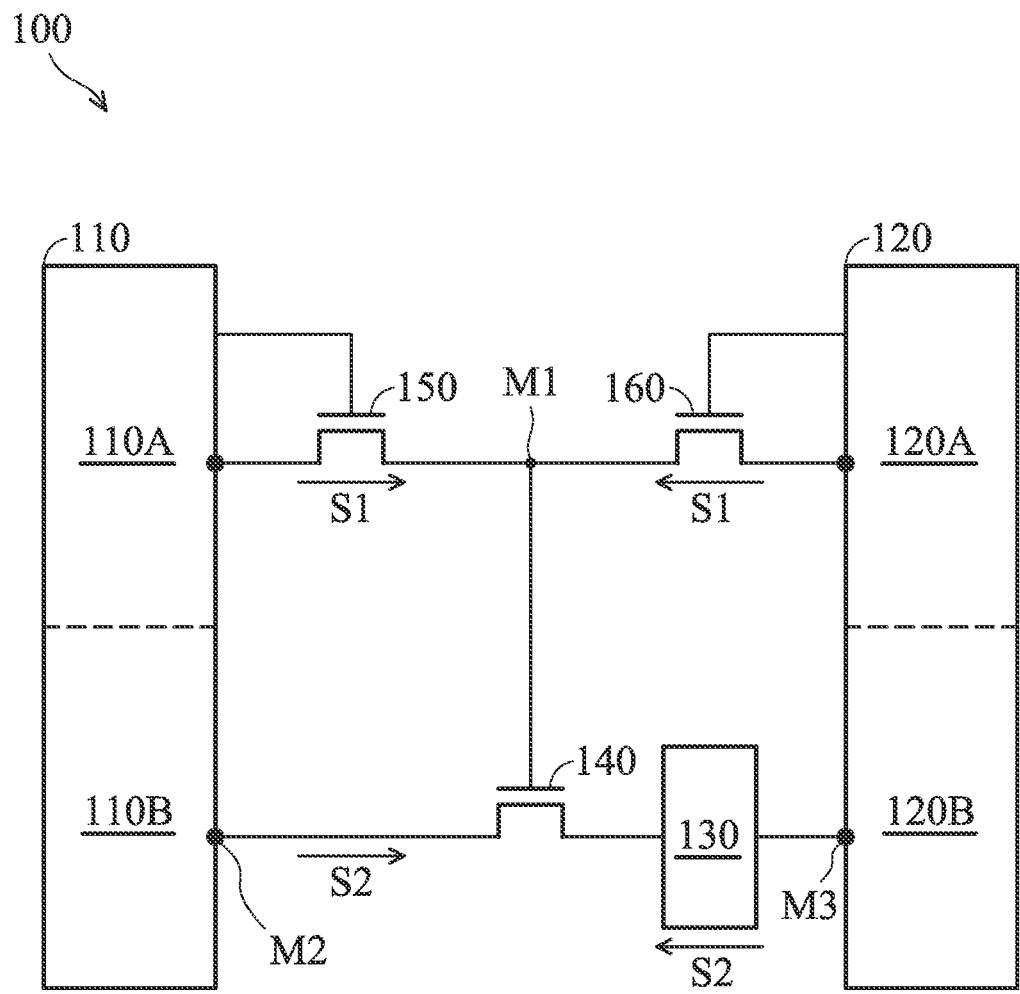
FIG. 1 is a diagram illustrating an example of a synapse system for operation for realizing spike-timing dependent plasticity (STDP) in accordance with an embodiment of the present invention.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a diagram illustrating an example of a synapse system for operation for realizing spike-timing dependent plasticity (STDP) in accordance with an embodiment of the present invention. A neuromorphic system requires two types of components: neurons and synapses. Neurons are essentially stimulus-driven spike signal generators, while synapses are connections between neurons. A neuron may be connected to many neighboring neurons, each by an individual synapse.

A synapse plays a critical role for the system's learning ability. Specifically, it must display STDP in order to support unsupervised learning, i.e., self-learning. A synapse between two neurons may receive a signal from either neuron. When it receives signals from both neurons, the closer the signals are to each other the more influential they are in changing the synapse conductance. The signals taken together may either have a potentiation (increased conductance) or depression (decreased conductance) effect, depending on the order of the signals.

This synaptic behavior can be implemented analogously by a bipolar RRAM (Resistive Random-Access Memory), which is sometimes referred to as resistance-switching element. Specifically, a bipolar RRAM is set (potentiated) by pulses in one direction and reset (depressed) by pulses in the other direction. These can be implemented as spike signals from the neuron at the respective end.

Referring to FIG. 1, the synapse system 100 includes a resistance-switching element 130 and three transistors 140, 150 and 150. Each of the three transistors 140, 150 and 160 could be an N-metal oxide semiconductor (MOS) transistor or a P-MOS transistor. The resistance-switching element 130 and the transistors 140, 150 and 150 are arranged between two neurons 110 and 120. For example, the neurons 110 and 120 are integrate-and-fire (I&F) neurons for firing a spike or a signal. The neuron 110 includes a pre-synaptic portion 110A and a post-synaptic portion 110B. In addition, the neuron 120 includes a pre-synaptic portion 120A and a post-synaptic portion 120B.

The drain and source of the transistor 140 are connected to the resistance-switching element 130 and the post-synaptic portion 110B of the neuron 110 (which is on the terminal M2). The gate of the transistor 140 is connected to the terminal M1. As, shown in FIG. 1, the transistors 150 and 160 are connected in series. The drain and source of the transistor 150 are connected to the terminal M1 and the pre-synaptic portion 110A of the neuron 110. The drain and source of the transistor 160 are connected to the terminal M1 and the pre-synaptic portion 120A of the neuron 120. In other words, the three transistors 140, 150 and 160 interconnect with each other on the terminal M1.

The resistance-switching element 130 is connected between the post-synaptic portion 120B of the neuron 120 (which is on the terminal M3) and the transistor 140. The input signal S1 is transmitted between the pre-synaptic portions 110A and 120A through the transistors 150 and 160 for passing low current. Either the input signal S1 could be transmitted from the neuron 110 to the neuron 120, or transmitted from the neuron 120 to the neuron 110. Afterwards, the voltage Vg on the terminal M1 can be interacted and determined according to the input signal S1.

The input signal S2 is transmitted between the post-synaptic portions 110B and 120B through the transistor 140 and the resistance-switching element 130 for passing higher current than the current of the transistors 150 and 160. Either the input signal S2 could be transmitted from the neuron 110 to the neuron 120, or transmitted from the neuron 120 to the neuron 110. Afterwards, the voltage Vs between the terminals M2 and M3 can be interacted and determined according to the input signal S2.

In one embodiment, the resistance-switching element 130 has a resistance value which could be adjusted or changed. Specifically, the resistance value of the resistance-switching element 130 is changed based on the time difference between the input signals S1 and S2. The detailed waveforms of the input signals S1 and S2 will be elaborated below to realize the STDP operations between the neurons 110 and 120.

Figure 2:
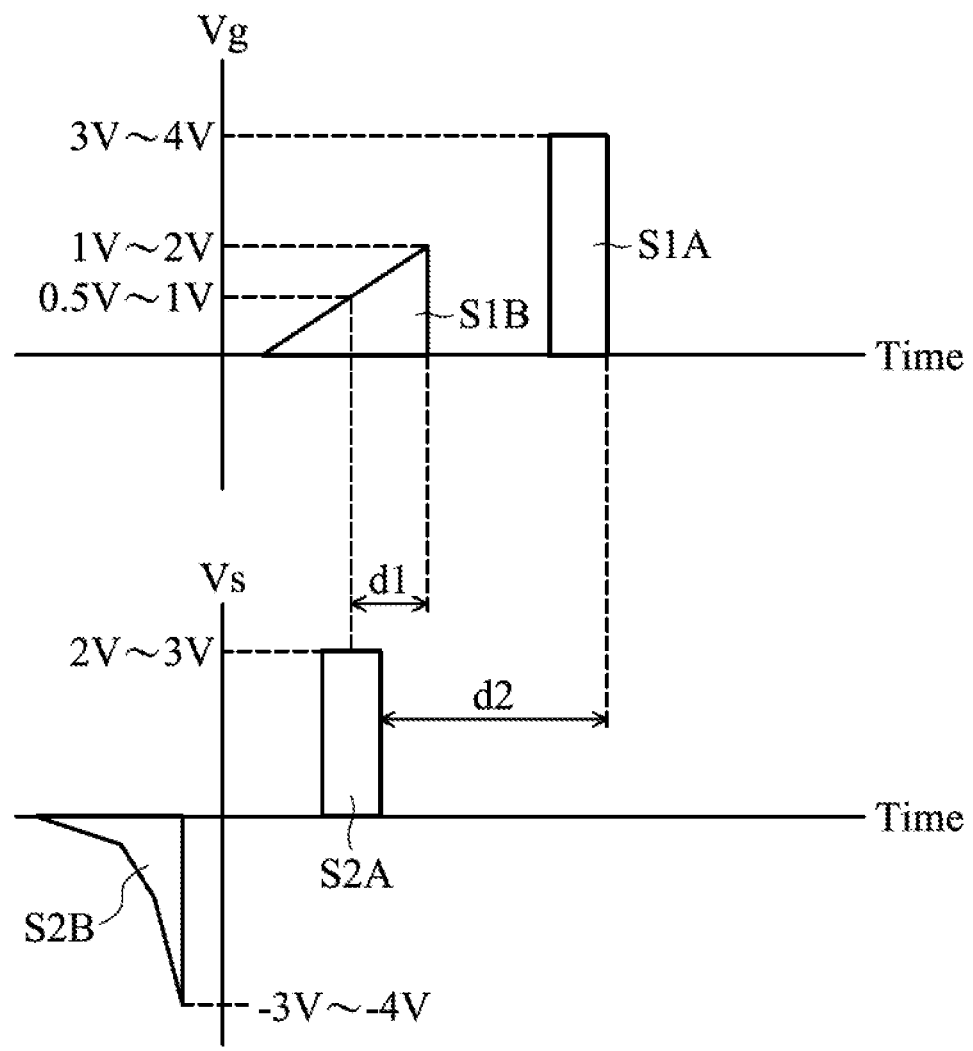
FIG. 2 is a graph depicting the waveforms of the input signals for performing the potentiation status in accordance with an embodiment of the present invention.

FIG. 2 is a graph depicting the waveforms of the input signals S1 and S2 for performing the potentiation status in accordance with an embodiment of the present invention. The input signal S1 includes a rectangle waveform S1A and a triangle waveform S1B which is linearly decreasing. Referring to the voltage Vg, the rectangle waveform S1A is about 3V~4V, and the triangle waveform S1B linearly decreases from 1V~2V to 0V. Furthermore, the input signal S2 includes a rectangle waveform S2A and an exponential waveform S2B which is decaying with an opposite polarity. Referring to the voltage Vs, the rectangle waveform S2A is about 2V~3V, and the exponential waveform S2B decays from −3V~−4V to 0V.

In the embodiment of FIG. 2, the potentiation status of the STDP operation is performed. The input signal S1 is transmitted before the transmission of the input signal S2. As shown in FIG. 2, the rectangle waveform S1A, the triangle waveform S1B, the rectangle waveform S2A and the exponential waveform S2B are transmitted sequentially. Specifically, the triangle waveform S1B is transmitted earlier than the rectangle waveform S2A by the duration d1. The rectangle waveform S1A is transmitted earlier than the rectangle waveform S2A by the duration d2. For example, the duration d1 is about 10 us~50 us (micro-second), the duration d2 is about 80 us~160 us.

It should be noted that the triangle waveform S1B overlaps with the rectangle waveform S2A, which means that the duration of the rectangle waveform S2A is shorter than and within the duration of the triangle waveform S1B. In the overlapping period, the resistance value of the resistance-switching element 130 decreases, the current increases, and the connection between the neurons 110 and 120 increases. The decrease of the resistance value of the resistance-switching element 130 is inversely proportional to the time difference between the triangle waveform S1B and the rectangle waveform S2A (which is duration d1). Therefore, the potentiation status could be performed.

Figure 3:
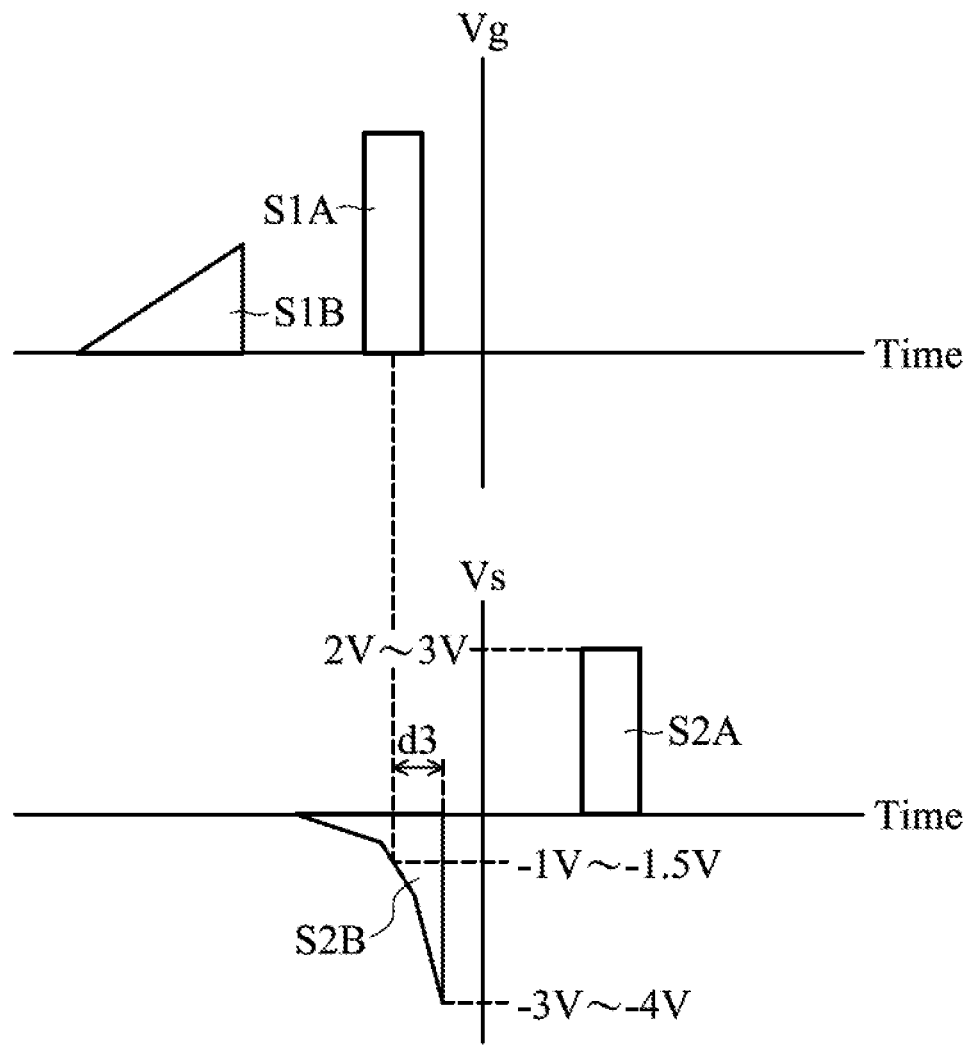
FIG. 3 is a graph depicting the waveforms of the input signals for performing the depression status in accordance with an embodiment of the present invention.

FIG. 3 is a graph depicting the waveforms of the input signals S1 and S2 for performing the depression status in accordance with an embodiment of the present invention. The input signal S1 is transmitted after the transmission of the input signal S2. As shown in FIG. 3, the rectangle waveform S2A, the exponential waveform S2B, the rectangle waveform S1A, and the triangle waveform S1B are transmitted sequentially. Specifically, the exponential waveform S2B is transmitted earlier than the rectangle waveform S1A by the duration d3. For example, the duration d3 is about 10 us~50 us.

It should be noted that the exponential waveform S2B overlaps with the rectangle waveform S1A, which means that the duration of the rectangle waveform S1A is shorter than and within the duration of the exponential waveform S2B. In the overlapping period, the resistance value of the resistance-switching element 130 increases, the current decreases, and the connection between the neurons 110 and 120 decreases. The increase of the resistance value of the resistance-switching element 130 is inversely proportional to the time difference between the exponential waveform S2B and the rectangle waveform S1A (which is duration d3). Therefore, the depression status could be performed.

Figure 4:
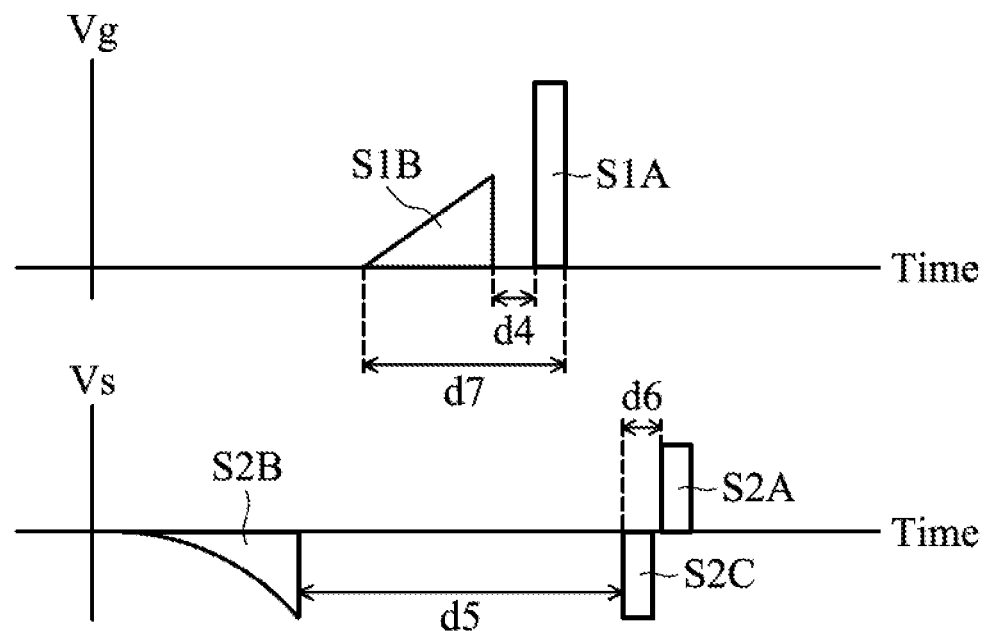
FIG. 4 is a graph depicting the waveforms of the input signals in accordance with another embodiment of the present invention.

FIG. 4 is a graph depicting the waveforms of the input signals S1 and S2 in accordance with another embodiment of the present invention. In the embodiment, the input signal S2 further includes an inverse rectangle waveform S2C with an opposite polarity compared with the rectangle waveform S2A. The inverse rectangle waveform S2C is arranged between the rectangle waveform S2A and the exponential waveform S2B. More specifically, the inverse rectangle waveform S2C is arranged following the rectangle waveform S2A.

Referring to the input signal S1 in FIG. 4, there is a duration d4 between the rectangle waveform S1A and the triangle waveform S1B. The total period of the rectangle waveform S1A and the triangle waveform S1B is the duration d7. Referring to the input signal S2 in FIG. 4, there is a duration d5 between the exponential waveform S2B and the inverse rectangle waveform S2C. In addition, the time difference between the rectangle waveform S2A and the inverse rectangle waveform S2C is the duration d6. It should be noted that duration d6 is shorter than duration d4, and duration d7 is shorter than duration d5.

Figure 5:
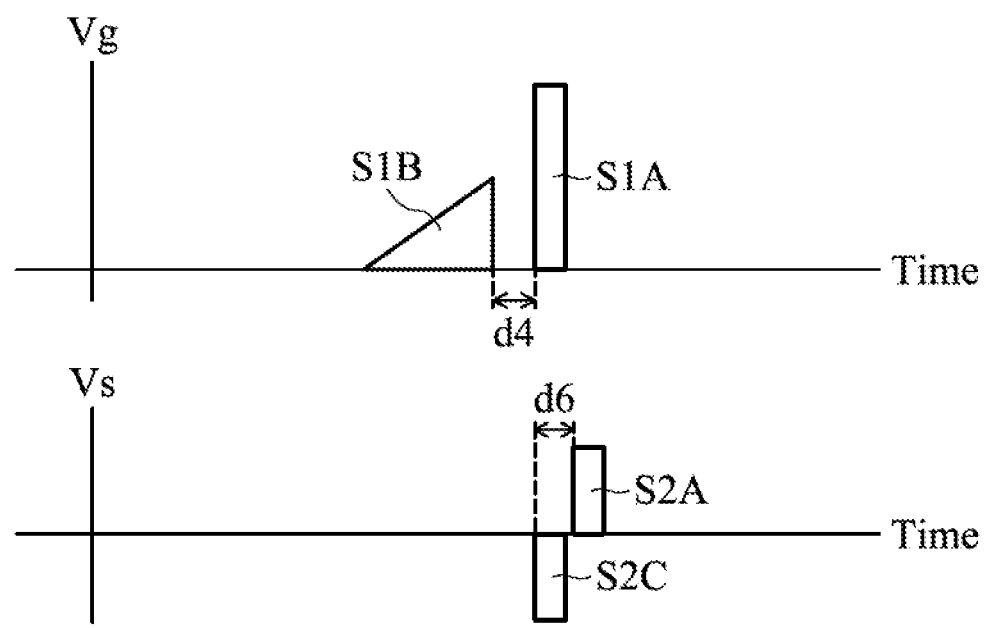
FIG. 5 is a graph depicting the overlap of the rectangle waveforms of the input signals in accordance with another embodiment of the present invention.

FIG. 5 is a graph depicting the overlap of the rectangle waveforms S1A and S2C of the input signals S1 and S2 in accordance with another embodiment of the present invention. In the embodiment, the inverse rectangle waveform S2C overlaps with the rectangle waveform S1A, which means that the inverse rectangle waveform S2C and the rectangle waveform S1A begin and end simultaneously. During the overlapping period, the inverse rectangle waveform S2C could be utilized to immediately cancel the potentiation effect of the rectangle waveform S2A. After the overlapping period the rectangle waveform S1B will be transmitted without overlapping other waveforms. Therefore, the strong potentiation can be avoided to improve the performance of the STDP operation.

Figure 6:
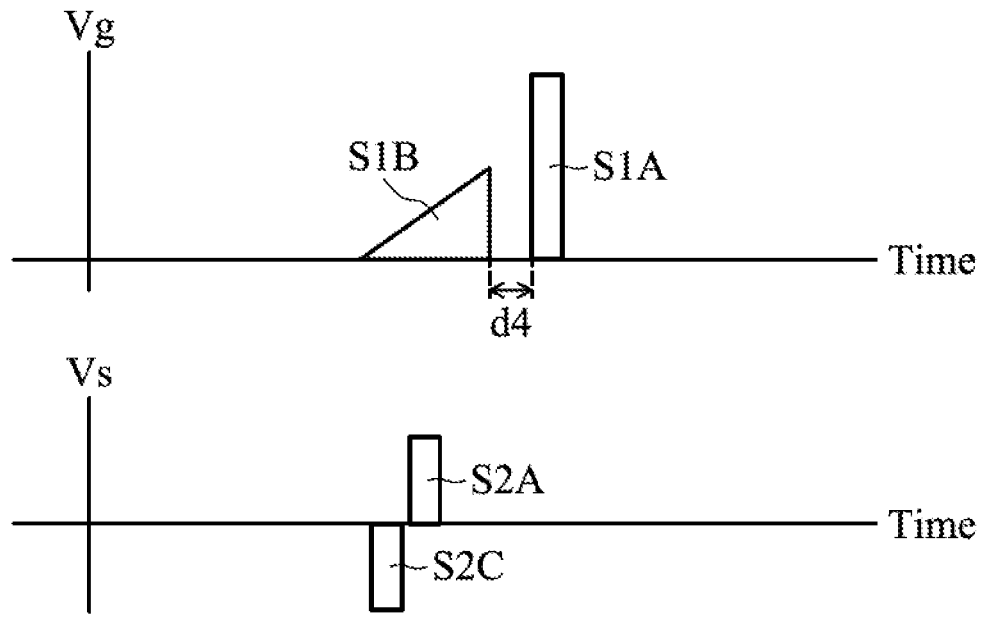
FIG. 6 is a graph depicting the waveforms of the input signals for performing the potentiation status in accordance with another embodiment of the present invention.

FIG. 6 is a graph depicting the waveforms of the input signals S1 and S2 for performing the potentiation status in accordance with another embodiment of the present invention. During the potentiation operation, the rectangle waveform S2A of positive polarity overlaps with a portion of the triangle waveform S1B for potentiation. However, the following inverse rectangle waveform S2C overlaps another portion of the triangle waveform S1B which is very small. Therefore, the depression will not be triggered by the inverse rectangle waveform S2C.

Figure 7:
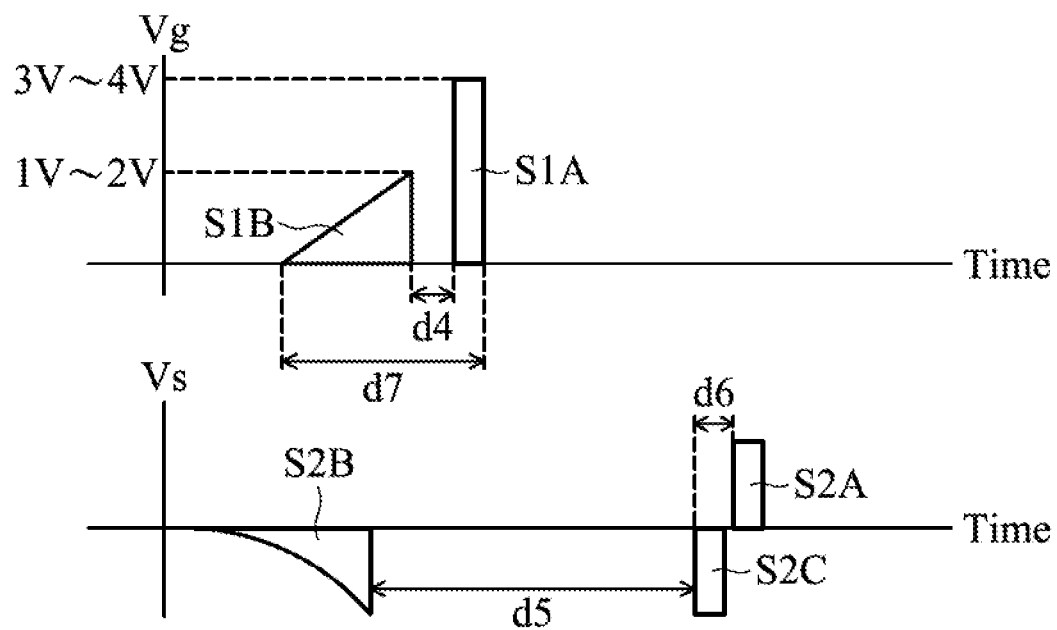
FIG. 7 is a graph depicting the waveforms of the input signals for performing the pre-depression status in accordance with another embodiment of the present invention.

FIG. 7 is a graph depicting the waveforms of the input signals S1 and S2 for performing the pre-depression status in accordance with another embodiment of the present invention. In the pre-depression period, the exponential waveform S2B partially overlaps with the triangle waveform S1B. Because the triangle waveform S1B is about 1~2V which is not high enough, the depression cannot be triggered by the exponential waveform S2B during the pre-depression period.

Figure 8:
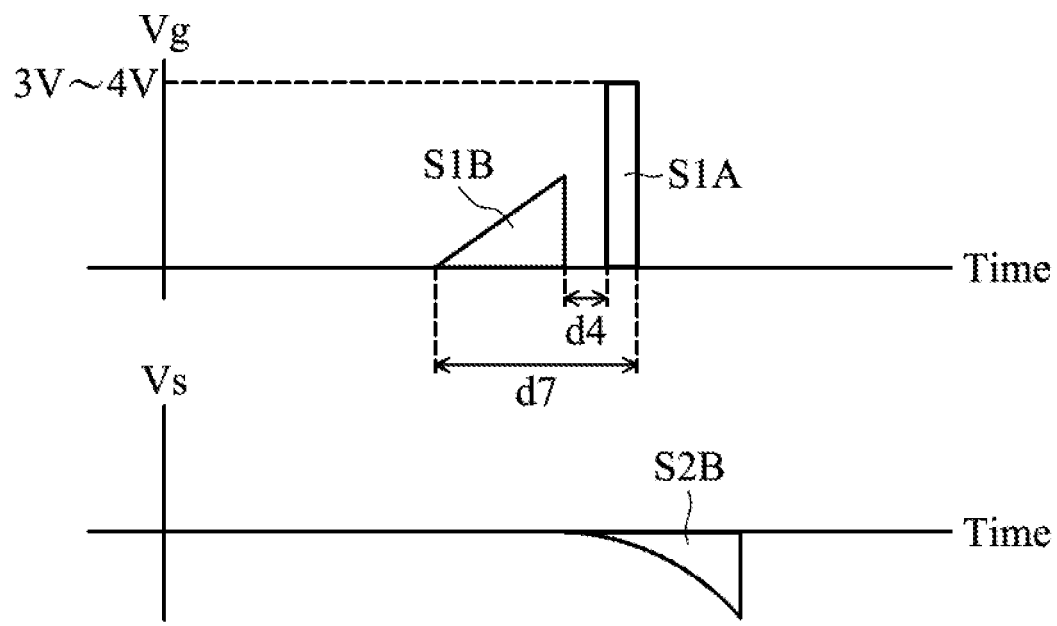
FIG. 8 is a graph depicting the waveforms of the input signals for performing the depression status in accordance with another embodiment of the present invention.

FIG. 8 is a graph depicting the waveforms of the input signals S1 and S2 for performing the depression status in accordance with another embodiment of the present invention. In the depression period, the exponential waveform S2B overlaps with the rectangle waveform S1A. Because the rectangle waveform S1A is about 3V~4V which is high enough, the depression can be triggered by the exponential waveform S2B during the depression period.

Figure 9:
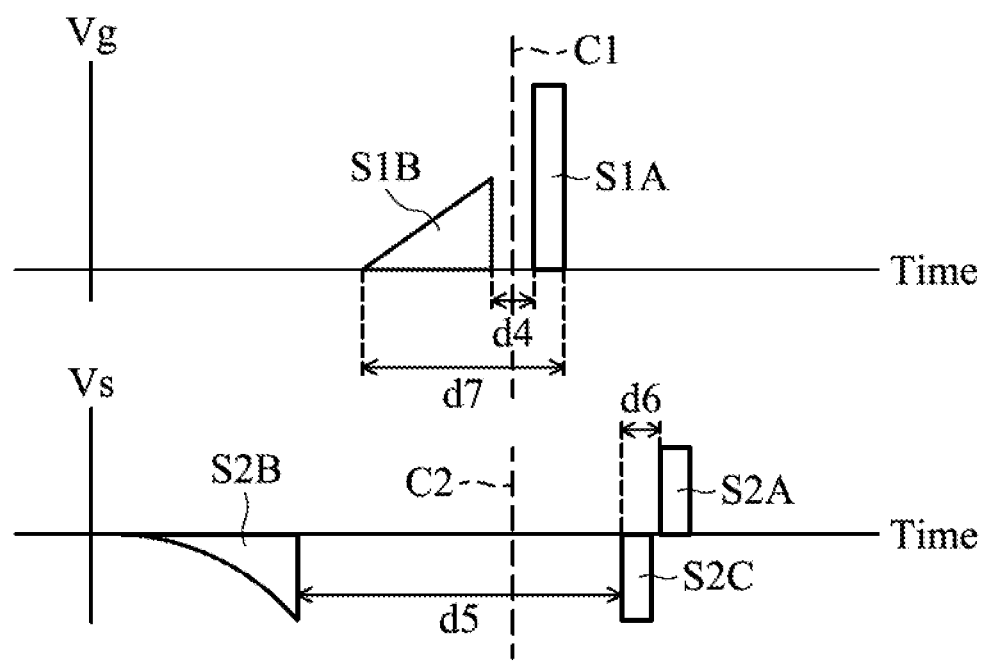
FIG. 9 is a graph depicting the waveforms of the input signals in accordance with another embodiment of the present invention.

FIG. 9 is a graph depicting the waveforms of the input signals S1 and S2 in accordance with another embodiment of the present invention. The central line C1 could be defined as the bisection line between the rectangle waveform S1A and the triangle waveform S1B. The gap between the rectangle waveform S1A and the central line C1 is identical to the gap between the triangle waveform S1B and the central line C1. Accordingly, the central line C2 could be defined as the bisection line between the exponential waveform S2B and the inverse rectangle waveform S2C. The gap between the exponential waveform S2B and the central line C2 is identical to the gap between the inverse rectangle waveform S2C and the central line C2.

In the embodiment, when the potentiation status is performed, the central line C1 is ahead to the central line C2 so that the triangle waveform S1B overlaps with the rectangle waveform S2A. When the depression status is performed, the central line C1 is behind the central line C2 so that the exponential waveform S2B overlaps with the rectangle waveform S1A.

Figure 10:
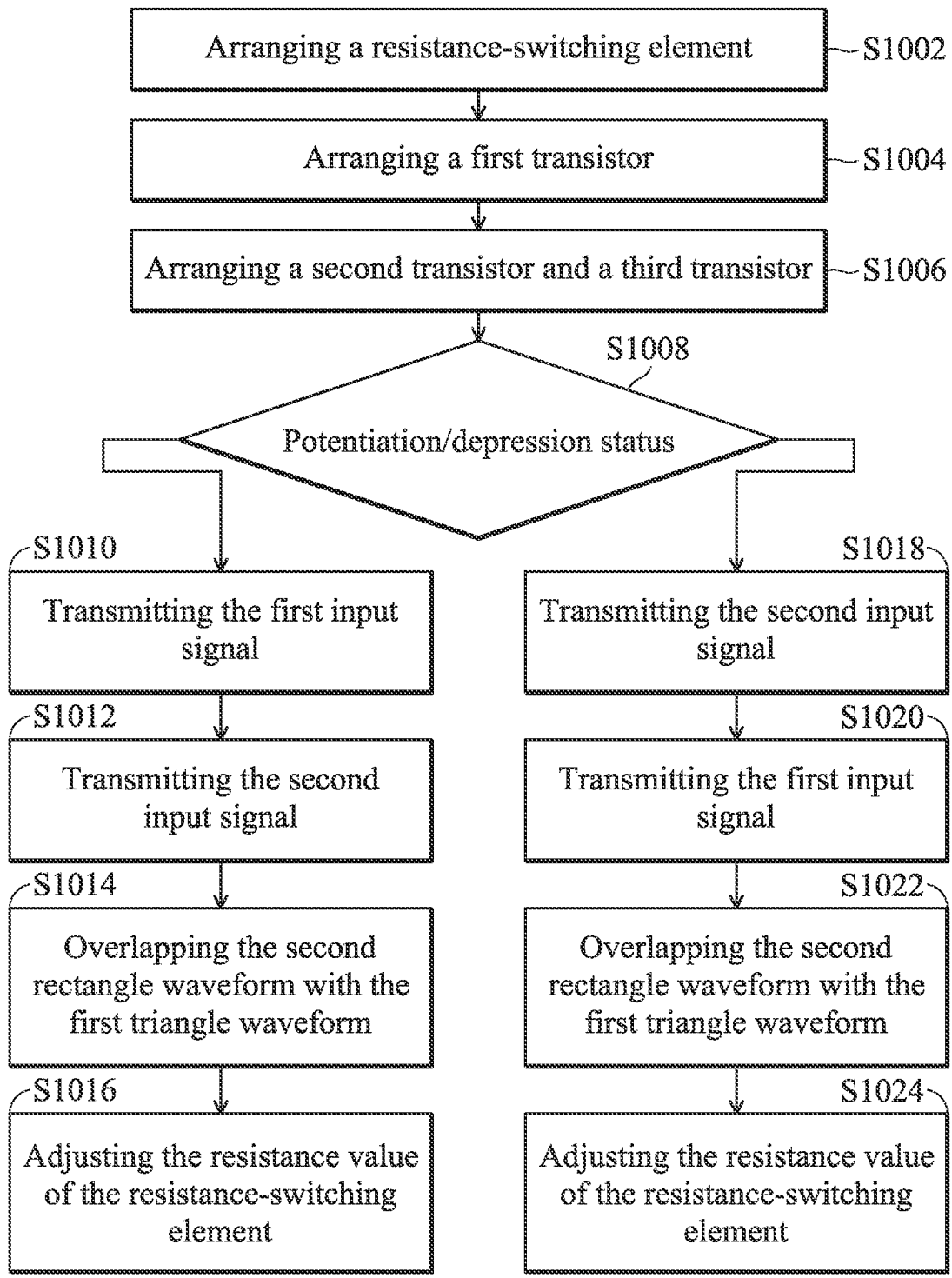
FIG. 10 is a diagram illustrating an example of a synapse method for operation for realizing STDP in accordance with an embodiment of the present invention.

FIG. 10 is a diagram illustrating an example of a synapse method for operation for realizing STDP in accordance with an embodiment of the present invention. In step S1002, the resistance-switching element 130 having a resistance value is arranged between two neurons 110 and 120. In step S1004, the transistor 140 (first transistor) is connected between the resistance-switching element 130 and one of the neurons 110 and 120. In step S1006, two transistors 150 and 160 (second and third transistors') are arranged between the neurons 110 and 120 and are connected in series which interconnects with the gate of the transistor 140. In some embodiments, the steps S1002~S1006 are executed simultaneously or executed in a different sequence.

In step S1008, either the potentiation status or the depression status of the STDP operation is performed. If the potentiation is performed, steps S1010~S1016 will be executed. If the depression is performed, steps S1018~S1024 will be executed. In step S1010, the input signal S1 (first input signal) is transmitted through the transistors 150 and 160. In step S1012, the input signal S2 (second input signal) is transmitted through the transistor 140. In step S1014, the second rectangle waveform of the input signal S2 overlaps with the first triangle waveform of the input signal S1. In step S1016, the resistance value of the resistance-switching element 130 is adjusted so that its decrease is inversely proportional to the time difference between the second rectangle waveform and the first triangle waveform.

Furthermore, in step S1018, the input signal S2 is transmitted through the transistor 140. In step S1020, the input signal S1 is transmitted through the transistors 150 and 160. In step S1022, the second rectangle waveform of the input signal S2 overlaps with the first triangle waveform of the input signal S1. In step S1024, the resistance value of the resistance-switching element 130 so that its increase is inversely proportional to the time difference between the second rectangle waveform and the first triangle waveform.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A synapse system to realize a spike timing dependent plasticity (STDP) operation, the synapse system comprising:
    a resistance-switching element having a resistance value, arranged between two neurons;
    a first transistor, connected between the resistance-switching element and one of the two neurons; and
    a second transistor and a third transistor, arranged between the two neurons, wherein a first drain/source terminal of the second transistor and a gate of the second transistor are connected to one of the two neurons, a first drain/source terminal of the third transistor and a gate of the third transistor are connected to the other of the two neurons, a second drain/source terminal of the second transistor and a second drain/source terminal of the third transistor are directly electrically connected together to a gate of the first transistor,
    wherein a first input signal is transmitted from the one of the two neurons to the other of the two neurons through the second transistor and the third transistor, and a second input signal is transmitted from the one of the two neurons to the other of the two neurons through the first transistor, the resistance value of the resistance-switching element is adjusted or changed, and the resistance-switching element, and the resistance value of the resistance-switching element is changed based on a time difference between the first input signal and the second input signal.

2. The synapse system to realize the STDP operation as claimed in claim 1, wherein each of two neurons comprises a pre-synaptic portion and a post-synaptic portion, the first input signal is generated by the pre-synaptic portion, and the second input signal is generated by the post-synaptic portion;
    the first drain/source terminal of the second transistor and the gate of the second transistor are directly connected to the one of the two neurons, the first drain/source terminal of the third transistor and the gate of the third transistor are directly connected to the other of the two neurons.

3. The synapse system to realize the STDP operation as claimed in claim 2, wherein the first transistor is connected between the post-synaptic portions of the two neurons; and
    the second transistor and the third transistor are connected between the pre-synaptic portions of the two neurons.

4. The synapse system to realize the STDP operation as claimed in claim 2, wherein the first input signal comprises a first rectangle waveform and a first triangle waveform which is linearly decreasing; and
    the second input signal comprises a second rectangle waveform and a second exponential waveform which is decaying with an opposite polarity.

5. The synapse system to realize the STDP operation as claimed in claim 4, wherein after the first input signal is transmitted, the second input signal is transmitted to perform a potentiation status of the STDP operation; and
    the second rectangle waveform overlaps with the first triangle waveform.

6. The synapse system to realize the STDP operation as claimed in claim 5, wherein a decrease of the resistance value of the resistance-switching element diminishes with increasing time difference between the second rectangle waveform and the first triangle waveform.

7. The synapse system to realize the STDP operation as claimed in claim 5, wherein a decrease of the resistance value of the resistance-switching element grows with increasing amplitude of the first triangle waveform.

8. The synapse system to realize the STDP operation as claimed in claim 4, wherein before the first input signal is transmitted, the second input signal is transmitted to perform a depression status of the STDP operation; and
the second rectangle waveform directly follows the first triangle waveform.

9. The synapse system to realize the STDP operation as claimed in claim 8, wherein:
an increase of the resistance value of the resistance-switching element diminishes with increasing time difference between the second rectangle waveform and the first triangle waveform.

10. The synapse system to realize the STDP operation as claimed in claim 8, wherein:
an increase of the resistance value of the resistance-switching element grows with increasing amplitude of the first rectangle waveform.

11. The synapse system to realize the STDP operation as claimed in claim 4, wherein the second input signal further comprises a second inverse rectangle waveform with an opposite polarity, and the second inverse rectangle waveform directly follows the first rectangle waveform.

12. The synapse system to realize the STDP operation as claimed in claim 11, wherein
a duration between the first triangle waveform and the first rectangle waveform is greater than a duration between the second rectangle waveform and the second inverse rectangle waveform; and
a duration between the second exponential waveform and the second inverse rectangle waveform is greater than the duration between the first triangle waveform and the first rectangle waveform.

13. A synapse method of realizing a spike timing dependent plasticity (STDP) operation between two neurons, the synapse method comprising:
providing a resistance-switching element having a resistance value between the two neurons;
connecting a first transistor between the resistance-switching element and one of the two neurons;
providing a second transistor and a third transistor between the two neurons, wherein a first drain/source terminal of the second transistor and a gate of the second transistor are connected to one of the two neurons, a first drain/source terminal of the third transistor and a gate of the third transistor are connected to the other of the two neurons, a second drain/source terminal of the second transistor and a second drain/source terminal of the third transistor are directly electrically connected together to a gate of the first transistor;
transmitting a first input signal from the one of the two neurons to the other of the two neurons through the second transistor and the third transistor, and transmitting a second input signal from the one of the two neurons to the other of the two neurons through the first transistor, wherein the resistance value of the resistance-switching element is adjusted or changed; and
changing the resistance value of the resistance-switching element based on a time difference between the first input signal and the second input signal.

14. The synapse method of realizing STDP operation as claimed in claim 13, wherein the first input signal comprises a first rectangle waveform and a first triangle waveform which is linearly decreasing; and
the second input signal comprises a second rectangle waveform and a second exponential waveform which is decaying with an opposite polarity;
wherein the first drain/source terminal of the second transistor and the gate of the second transistor are directly connected to the one of the two neurons, the first drain/source terminal of the third transistor and the gate of the third transistor are directly connected to the other of the two neurons.

15. The synapse method of realizing the STDP operation as claimed in claim 14, wherein transmitting the second input signal after the first input signal is transmitted; and
overlapping the second rectangle waveform with the first triangle waveform to perform a potentiation status of the STDP operation.

16. The synapse method of realizing an STDP operation as claimed in claim 15, wherein a decrease of the resistance value of the resistance-switching element diminishes with increasing time difference between the second rectangle waveform and the first triangle waveform, and the decrease of the resistance value of the resistance-switching element grows with an amplitude of the first triangle waveform.

17. The synapse method of realizing the STDP operation as claimed in claim 14, comprising:
transmitting the second input signal before the first input signal is transmitted; and
overlapping the second rectangle waveform with the first triangle waveform to perform a depression status of the STDP operation.

18. The synapse method of realizing the STDP operation as claimed in claim 17, wherein an increase of the resistance value of the resistance-switching element diminishes with increasing time difference between the second rectangle waveform and the first triangle waveform, and the increase of the resistance value of the resistance-switching element grows with an amplitude of the first rectangle waveform.

19. The synapse method of realizing the STDP operation as claimed in claim 14, wherein the second input signal further comprises a second inverse rectangle waveform with an opposite polarity, and the second inverse rectangle waveform directly follows the first rectangle waveform.

20. The synapse method of realizing the STDP operation as claimed in claim 19, wherein a first duration between the first triangle waveform and the first rectangle waveform is greater than a second duration between the second rectangle waveform and the second inverse rectangle waveform; and
a third duration between the second exponential waveform and the second inverse rectangle waveform is greater than a fourth duration between the first triangle waveform and the first rectangle waveform.

* * * * *